United States Patent [19]

Anzai

[11] Patent Number: 5,233,207
[45] Date of Patent: Aug. 3, 1993

[54] MOS SEMICONDUCTOR DEVICE FORMED ON INSULATOR

[75] Inventor: Kenji Anzai, Tokyo, Japan

[73] Assignee: Nippon Steel Corporation, Tokyo, Japan

[21] Appl. No.: 719,626

[22] Filed: Jun. 24, 1991

[30] Foreign Application Priority Data

Jun. 25, 1990 [JP] Japan .................................. 2-168105

[51] Int. Cl.⁵ ..................... H01L 27/12; H01L 27/13; H01L 29/78
[52] U.S. Cl. ......................................... 257/66; 257/71; 257/329; 257/347; 257/351
[58] Field of Search ..................... 357/23.7, 59 E, 4; 257/66, 71, 329, 347, 350, 351

[56] References Cited

U.S. PATENT DOCUMENTS 4,554,572 11/1985 Chatterjee ..................... 357/59 E
4,633,284 12/1986 Hansell et al. ................ 357/23.7

OTHER PUBLICATIONS

Sze, S. M. Semiconductor Devices, c. 1985 Bell Telephone Laboratories, pp. 347-348.

Primary Examiner—William Mintel
Assistant Examiner—Robert Limanek
Attorney, Agent, or Firm—Pollock, Vande Sande & Priddy

[57] ABSTRACT

An MOS type semiconductor device having an SOI structure comprises an insulating film formed on a semiconductor substrate, a conductive layer formed on the insulating film serving as a gate electrode, a dielectric film covering upper and side surfaces of the conductive and the insulating film and a single semiconductor layer formed on the dielectric film, the semiconductor layer including a first part formed over an upper surface of the conductive layer, a second part formed on a side surface of the conductive layer and a third part formed over a part of the dielectric film covering directly the insulating film so that the first and third parts serve as a source and a drain or vice versa and the second part serves as a channel.

27 Claims, 4 Drawing Sheets

MOS SEMICONDUCTOR DEVICE FORMED ON INSULATOR

BACKGROUND OF THE INVENTION

The present invention relates to the structure of an MOS type semiconductor device in which MOS elements can be integrated at a high density.

DESCRIPTION OF THE RELATED ART

Figure 7:
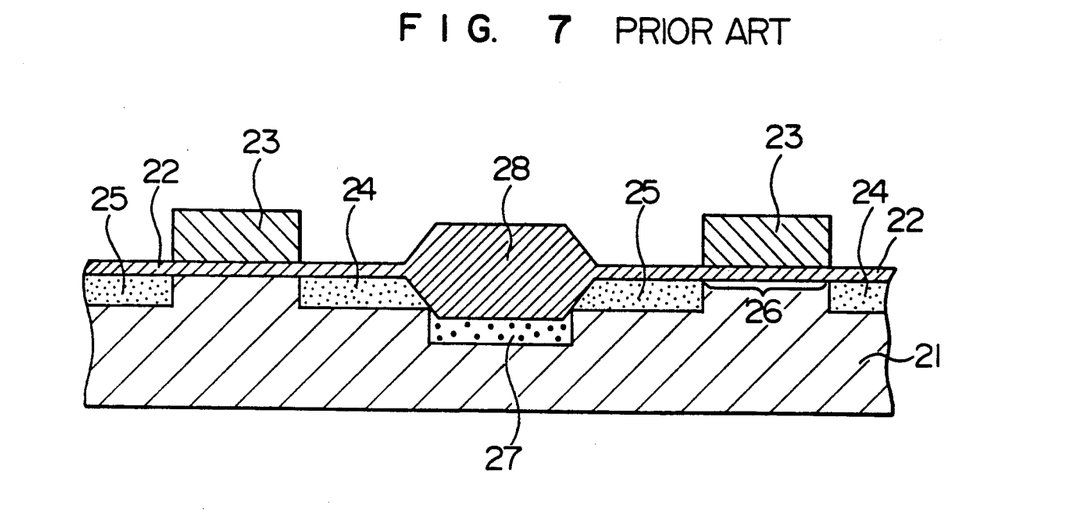
FIG. 7 is a cross-sectional view of a prior art planar type MOS type semiconductor device.

FIG. 7 is an outlined cross-sectional view of a prior art planar type MOS type semiconductor device. The prior art MOS type semiconductor device is generally of a planar type having a structure, in which a dielectric film (silicon oxide film or CVD nitride film) 22 and a gate electrode 23 ar disposed on a semiconductor silicon substrate 21, as indicated in FIG. 7, and a source electrode 24 and a drain electrode 25 are formed by using them as a mask. In this structure an effective channel length 26 governing the electric characteristics of the MOS type semiconductor device is determined by a finished size of the gate electrode 23.

Further, in the case where a plurality of MOS type semiconductor elements are formed, an isolating field oxide film structure 28 for preventing electric interaction between them is required, a set of these elements being formed on a semiconductor silicon substrate 21 or in a well. Under the field oxide film 28 there is disposed an inversion preventing high impurity concentration layer 27.

In order to integrate elements at a high density, a vertical type MOS type semiconductor device formed in a trench portion in a silicon substrate has been proposed (See "A COMPOSED TRENCH TRANSISTOR (CTT) CELL FOR 16/64 MB DRAMS", VLSI Sympo. '89, pp. 65-66). Also in this type of semiconductor device, the basic structure as an MOS type semiconductor device in which a source electrode and a drain electrode are formed in a semiconductor silicon substrate and which is driven by a gate electrode disposed thereover, is the same as that indicated in FIG. 7. Also in the case where a plurality of MOS type semiconductor elements are formed, an isolating field oxide film structure is additionally required for isolating them from each other, as in the planar type device.

Heretofore there is a problem that the effective channel length 26 governing the electric characteristics of the MOS type semiconductor device is determined by the finished size of the gate electrode and thus influenced greatly by the precision of fine processing.

Further, in the planar type MOS type semiconductor device it is difficult to integrate the elements at a high density and in the trench type MOS type semiconductor device proposed for solving this problem the drawback is that it requires a complicated structure the gate electrode, the source electrode and the drain electrode are formed in the inner wall of a trench. In addition, the field oxide film should be additionally provided for preventing electric interaction between different elements.

Furthermore, in an MOS type semiconductor device having a plurality of MOS type transistors formed on a common semiconductor substrate 21, or in a common well, the substrate potentials for all the MOS type transistors should be equal to each other. Therefore it is not possible to select different substrate potentials for different MOS transistors and the degree of freedom for the controllability of electric characteristics is small

SUMMARY OF THE INVENTION

The object of the present invention is to provide an MOS type semiconductor device capable of solving the problems described above, having a relatively simple structure and an excellent controllability of electric characteristics, and in which MOS type elements can be integrated at a high density.

In order to achieve the above object, according to a first aspect of the present invention, an MOS type semiconductor device comprises a) a first insulating layer; b) a first conductive layer formed on the first insulating layer and having an upper surface distant from the first insulating layer and a side surface connecting the upper surface to the first insulating layer; c) a second insulating layer covering the upper surface and the side surface of the first conductive layer as well as the first insulating layer; and d) a semiconductor layer covering the second insulating layer and having a first part formed on the upper surface of the first conductive layer, the first part including impurities of a first conductivity type; a second part formed on the side surface of the first conductive layer and jointed with the first part, the second part including impurities of a second conductivity type different from the first conductivity type; and a third part formed at a place where the second insulating layer covers directly the first insulating layer, and jointed with the second part, the third part including impurities of the first conductivity type.

According to a second aspect of the present invention, an MOS type semiconductor device comprises a) a first insulating layer; b) a plurality of first conductive layers formed selectively on the first insulating layer, each of which has an upper surface distant from the first insulating layer and a side surface connecting the upper surface to the first insulating layer; c) a second insulating layer covering the upper surface and the side surface of each of the first conductive layers as well as the first insulating layer adjacent to the side surface; and d) a semiconductor layer covering the second insulating layer, the semiconductor layer being formed on the first insulating layer, in separate element layers corresponding to the respective first conductive layers, each element layer having a first part formed on the upper surface of the corresponding first conductive layer,, the first part including impurities of a first conductivity type; a second part formed on the side surface of the corresponding first conductive layer and jointed with the first part, the second part including impurities of a second conductivity type different from the first conductivity type; and a third part formed at a place, where the second insulating layer covers directly the first insulating layer and jointed with the second part, the third part including impurities of the first conductivity type.

According to a third aspect of the present invention, an MOS type semiconductor device comprises a) a first insulating layer; b) a conductive layer formed on the first insulating layer and having an upper surface distant from the first insulating layer and a side surface connecting the upper surface to the first insulating layer; c) a second insulating layer covering the upper surface and the side surface of the conductive layer as well as the first insulating layer; and d) a semiconductor layer covering the second insulating layer and having a first part formed on the upper surface of the conductive layer, the first part including impurities of a first conductivity type; a second part formed on the side surface of the conductive layer and jointed with the first part, the second part including impurities of a second conductivity type different from the first conductivity type; and a third part disposed at a place which covers the first insulating layer or superposition of the first and second insulating layers and uncovers the conductive layer, and jointed with the second part, the third part including impurities of the first conductivity type.

According to a fourth aspect of the present invention, an MOS type semiconductor device comprises a) a first insulating layer; b) a conductive layer formed on the first insulating layer and having an upper surface distant from the first insulating layer and a side surface connecting the upper surface to the first insulating layer; c) a second insulating layer covering the upper surface and the side surface of the conductive layer as well as the first insulating layer; and d) a semiconductor layer covering the second insulating layer and having a first part formed on the upper surface of the conductive layer, the first part including impurities of a first conductivity type at a high concentration; a second part formed on the side surface of the conductive layer and jointed with the first part, the second part including impurities of a second conductivity type different from the first conductivity type at a concentration lower than the first part, and a third part disposed at a place, where the second insulating layer covers directly the first insulating layer, and jointed with the second part, the third part including impurities of the first conductivity type at a concentration higher than the second part.

Since the MOS type semiconductor device according to the present invention utilizes an SOI (silicon on insulator) structure, the isolation of elements can be easily performed. That is, it is sufficient to separate the semiconductor layer (polycrystalline silicon) into a plurality of silicon islands by the prior art photolithographic processing technique and therefore it is unnecessary to conduct the thermal processing for formation of the field oxide film, which is necessary for isolation of the elements in the prior art device. For this reason, it is not necessary to take into account the problem of the channel narrowing due to bird's beaks at the formation of the field oxide film. Further, in the MOS type semiconductor device according to the present invention, since the vertical structure, in which the elements are arranged in the direction perpendicular to the substrate, is adopted, high density integration is possible. In addition, since the semiconductor layer located on the side surface of the first gate electrode is utilized as the channel of the MOS type semiconductor device, the effective channel length is determined by the thickness of the first gate electrode. For this reason, as compared with the prior art MOS type semiconductor device, in which electric characteristics are governed by the fine processing precision of the gate electrode, it is possible in the MOS type semiconductor device according to the present invention to control its characteristics with a higher precision. Furthermore the present device has a structure, which is useful particularly for miniature construction, in which the size of each element in the horizontal direction is as small as submicrons.

In addition, it is possible to control the potential of the substrate electrode by the field effect by forming the second dielectric layer on the substrate electrode and the second gate electrode on the second dielectric layer, whose potential is to be controlled.

DESCRIPTION OF THE PREFERRED EMBODIMENTS

Hereinbelow the first embodiment of the present invention will be explained referring to FIG. 1 which is an outlined cross-sectional view of a semiconductor device, in which MOS type field effect transistors are formed.

The substrate structure of the MOS type semiconductor device according to the present embodiment is a structure, in which an insulating film (first insulating layer) 2 is formed on a semiconductor silicon substrate (semiconductor substrate) 1. In this case, a thermal oxidation film ($SiO_2$) of the semiconductor silicon substrate 1 or an oxide film ($SiO_2$) formed by the vapor phase growth is suitable for the insulating film 2. The thickness thereof is selected in a range from 0.1 $\mu$m to several $\mu$m. For the purpose of reducing wiring capacitance of the device formed on the insulating film 2 for increasing the speed of the device, a thicker insulating film 2 is more advantageous and a smaller dielectric constant of the material therefor is more preferable. However, since it is desirable that thermal characteristics of the material ar close to those of the materials constituting the MOS type semiconductor device formed thereon, a silicon oxide film is the most suitable for the insulating film.

When fabricating elements on the insulating layer 2, the semiconductor silicon substrate 1 may be omitted if the thickness of the insulating film 2 is increased so that it has a strength as high as the substrate 1. Further it is possible also to adopt a multi-layer element structure, in which there exist other electric elements (for example semiconductor devices, resistors, capacitors, and the like) under the insulating film 2, which may be connected upwards and downwards.

Figure 1:
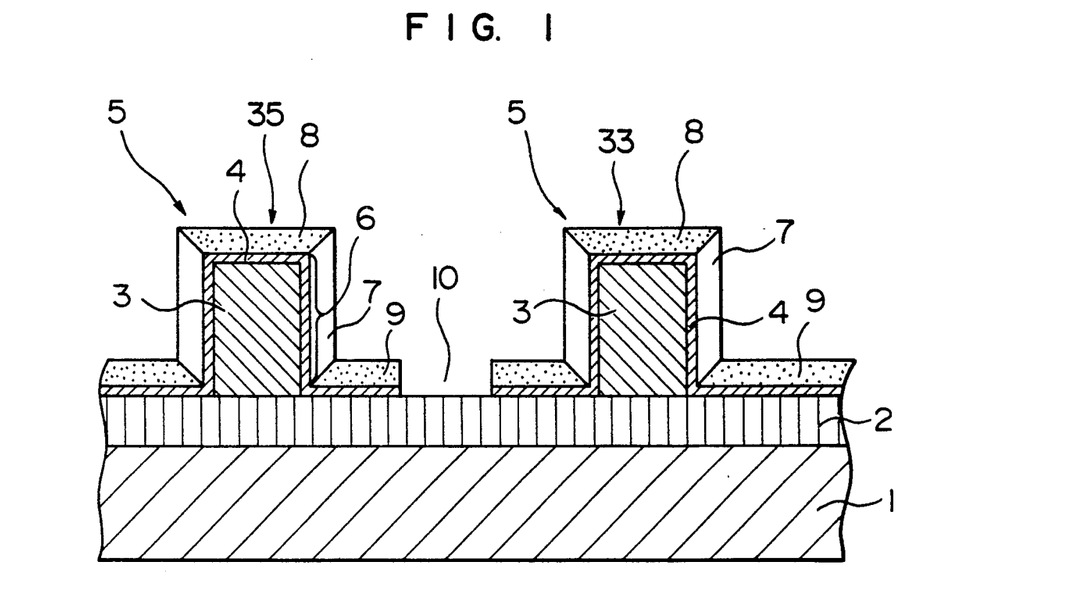
FIG. 1 is a cross-sectional view indicating the structure of a MOS type semiconductor device according to a first embodiment of the present invention.

As indicated in FIG. 1, the first gate electrode (first conductive layer) 3 is disposed on the insulating film 2 described above and the first dielectric film (second insulating layer) 4 as well as the semiconductor silicon layer (semiconductor layer) 5 are formed so as to cover the first gate electrode 3.

For the first gate electrode 3, a mono-layer of a metallic material such as Cr, Mo, W, Cu and Al is most desirable and a mixture of such metallic materials, high impurity concentration N type polycrystalline silicon or silicide of a metallic material having a high melting point may be used therefor. In the case where multi-layered different sorts of metals are used, attention should be paid to the fact that the work function varies in the vertical direction. The width of a processed line for the first gate electrode 3 may be of submicron order and fluctuations in the processing have no influences on the electric characteristics of the present MOS type semiconductor device. The film thickness of the first gate electrode is a predominant factor determining the effective channel length 6 of the present MOS type semiconductor device and a thickness of about 0.5-2 μm may be chosen therefor. If it is too thick, a difference in level has an influence on the layers formed in the succeeding fabrication steps. On the contrary, if it is too thin, the short channel effect has an influence on the Present MOS type semiconductor device.

A silicon nitride film, a silicon oxide film, and the like formed by the vapor phase growth method are suitable for the first dielectric film 4 and a film thickness from 10 to several tens of nm is chosen therefor.

A polycrystalline silicon thin layer or an epitaxial silicon thin layer (produced by the laser recrystallization or the lateral epitaxial growth) 20 to 300 nm thick is used for the semiconductor silicon layer 5.

In the semiconductor silicon layer 5, the part (first part) 8 located on the upper surface of the first gate electrode 3 serves as the source (or drain) electrode and a part of the semiconductor silicon layer (second part) 7 located on the side surface of the first gate electrode 3 is doped in low concentration ($5 \times 10^{15} - 1 \times 10^{17}$ cm$^{-3}$) with P (or N) type impurities and serves as the channel of the present MOS type semiconductor device.

Further, another part of the semiconductor silicon layer (third part) 9 superposed on the insulating film 2 through the first dielectric film 4, that is the part other than those parts opposite to the first gate electrode 3 in the semiconductor silicon layer 5, serves as the drain (or source) electrode. Both the first and third parts 8, 9 are N (or P) type high impurity concentration layers. For the formation of the N (or P) type impurity layers a technique is used, by which ions are implanted differently by the oblique ion implantation method by forming a side wall mask on the side surface of the first gate electrode outside of the semiconductor silicon layer 5.

Although the conductors for the respective electrodes are not indicated in FIG. 1, they can be easily formed by the prior art fine processing technique. Further, in the case where it is required to isolate the different elements from each other as in the case where a plurality of MOS type semiconductor elements are formed on a common insulating layer, an isolating zone 10 is formed. In this way, in FIG. 1, two MOS type semiconductor regions 33 and 35 are formed.

Figure 2:
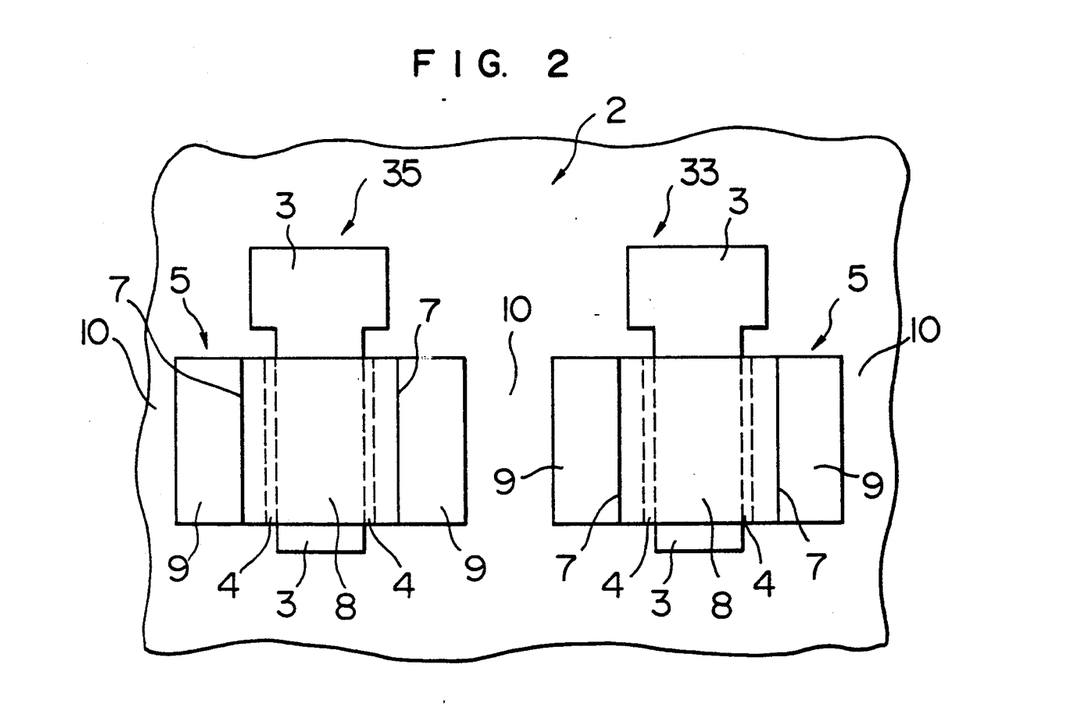
FIG. 2 is a plan view of the MOS type semiconductor device shown in FIG. 1.
Figure 3:
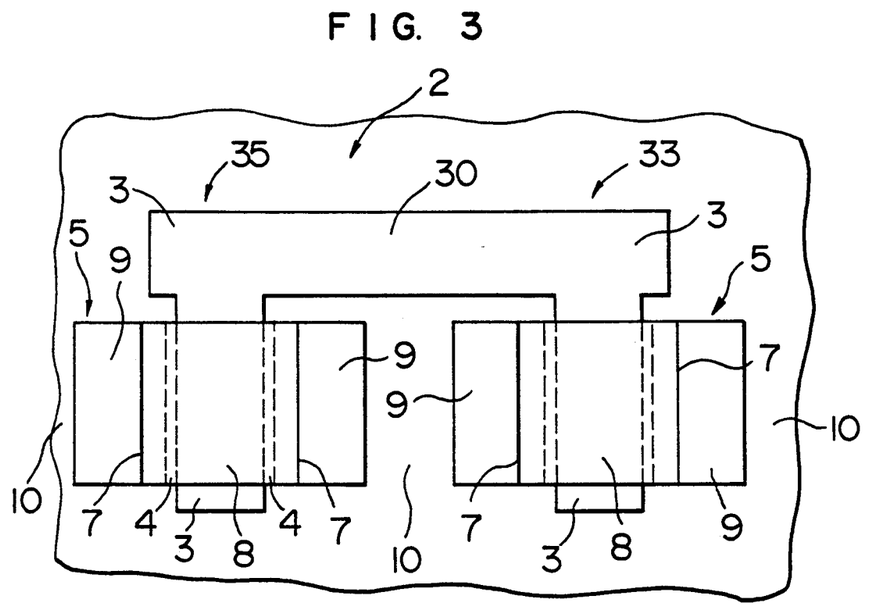
FIGS. 3 and 4 show plan views of modifications of the MOS type semiconductor device shown in FIG. 1.
Figure 4:
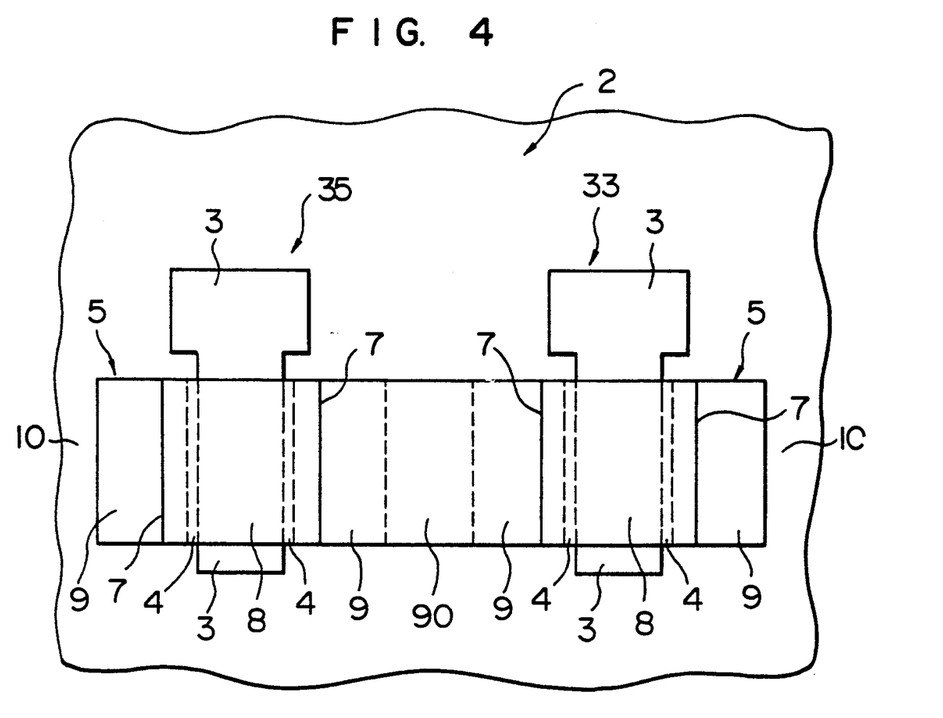

FIG. 2 is a plan view of the MOS type semiconductor device shown in FIG. 1 and FIGS. 3 and 4 show modifications thereof. In FIGS. 2 to 4, the components which are the same as or similar to those shown in FIG. 1 are denoted by the same reference numerals. As indicated in FIG. 2, the different semiconductor elements 33 and 35 are separated by the isolating zone 10 so that they are constructed, as if they are islands formed in a sea of the insulating film 2. FIGS. 3 and 4 show embodiments for electrically connected the semiconductor elements 33 and 35. FIG. 3 shows an example, in which the first gate electrodes 3 of the semiconductor elements 33 and 35 are connected electrically through a conductor 30. The conductor 30 is made of the same material as the first gate electrodes 3 and formed in a manufacturing step together with the first gate electrodes 3. FIG. 4 shows an example, in which the third parts 9 constituting the drains (or sources) of the semiconductor elements 33 and 35 are extended to form a connecting region 90, which connects them electrically. This connecting region 90 is made of the same material as the drains (or sources) 9 and is formed in a step together with the drains (or sources) 9. In these figures, a complementing MOS type semiconductor device can be obtained by constructing the semiconductor element 33 with a channel 7 of P (or N) conductivity type and a drain (or source) electrode 8, 9 of N (or P) conductivity type, and the semiconductor element 35 of opposite polarity with a channel 7 of N (or P) conductivity type and a drain (or source) electrode 8, 9 of P (or N) conductivity type. Although the first dielectric film 4 is put between the drain (or source) electrode 9 and the insulating film 2 for the reasons of fabrication steps, this first dielectric film 4 is not necessarily required between the drain (or source) electrode 9 and the insulating film 2. In this example, it is possible to provide a higher insulation by superposing the first dielectric film 4 on the insulating film 2.

Figure 5:
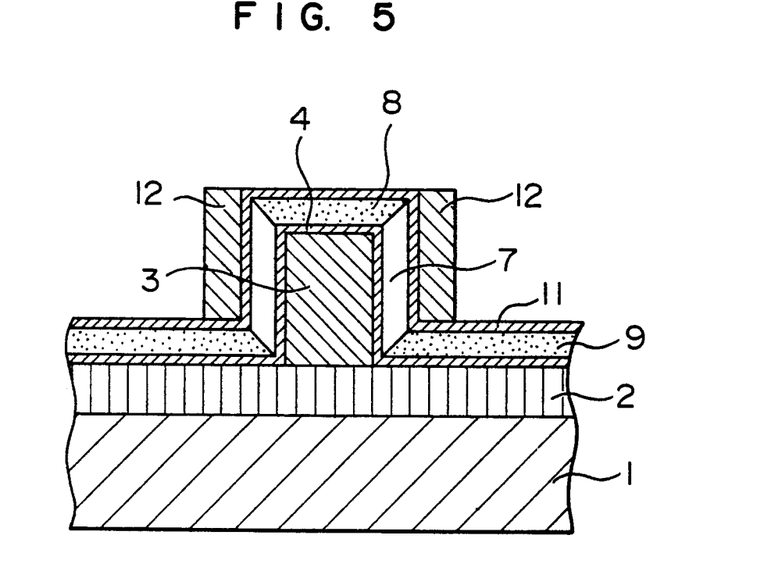
FIG. 5 is a cross-sectional view showing the structure of an MOS type semiconductor device according to a second embodiment of the present invention.

Next, the second embodiment of the present invention will be explained, referring to FIG. 5 which is an outlined cross-sectional view of an MOS type semiconductor device. The basic structure is identical to that of the MOS type semiconductor device indicated in FIG. 1. However, the second embodiment represents a structure, in which a second dielectric film (third insulating layer) 11 and a second gate electrode (second conductive layer) 12 are formed further outside of the channel 7, as shown in FIG. 5. The material and the film thickness of the second dielectric film 11 and the second gate electrode 12 can be identical to the first dielectric film 4 and the first gate electrode 3 in the first embodiment. In this embodiment, the second gate electrode 12 is disposed and the potential thereof works so as to control the potential of the channel 7 by the field effect function.

Figure 6A:
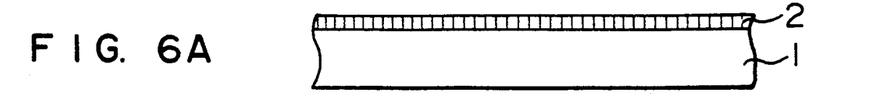
FIGS. 6A–6G are cross-sectional views showing fabrication steps of an MOS semiconductor device according to the present invention.
Figure 6B:
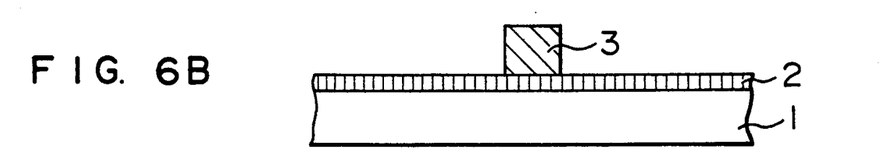

Now a method for fabricating the semiconductor device indicated in FIG. 1 will be explained, referring to FIGS. 6A to 6G. At first, as indicated in FIG. 6A, the insulating film 2 of SiO$_2$ is formed on the Si substrate 1 at a thickness of 0.1 to several μm by the thermal treatment or by the chemical vapor deposition (CVD). Then a polycrystalline silicon film 0.5-2 μm thick is formed on the insulating layer 2 by the LPCVD (low pressure chemical vapor deposition) method, which is transformed into the N type polycrystalline silicon film by diffusing thermally phosphor (P) therein. A predetermined pattern is formed by photolithoetching this polycrystalline silicon layer to form the first gate electrode 3, as indicated in FIG. 6B.

Figure 6C:
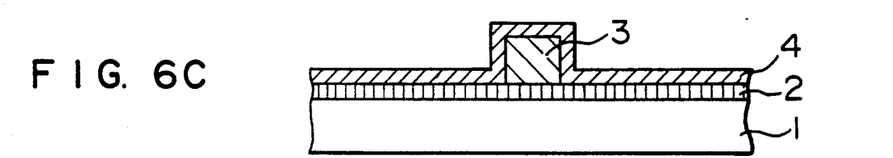

Next, as indicated in FIG. 6C, the silicon nitride (Si$_3$N$_4$) layer (first dielectric film) 4 is formed by the LPCVD method at a thickness of 10 to several tens μm so as to cover the first gate electrode 3 and the exposed part of the insulating film 2.

Figure 6D:
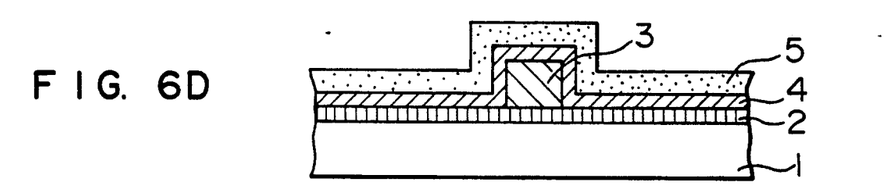

Then, as indicated n FIG. 6D, a Polycrystalline or epitaxial silicon thin film 5 is formed on the first dielectric film 4 at a thickness of 20 to 300 nm and the semiconductor silicon layer 5 is formed by doping it with P or N type impurities at a concentration of $5 \times 10^{15} - 1 \times 10^{17}$ cm$^{-3}$ (ion implantation). In this case, the oblique ion implantation method is used so that ions are implanted in the semiconductor silicon layer 5 located on the side surface of the gate electrode 3.

Figure 6E:
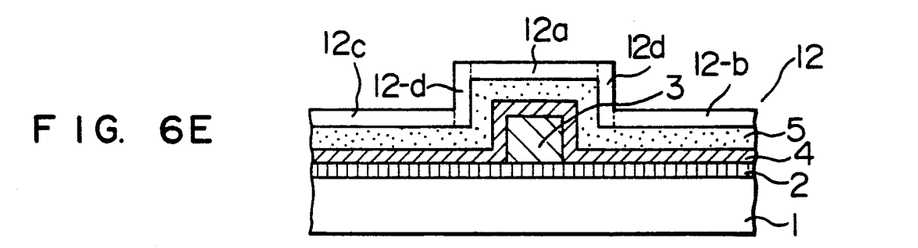
Figure 6F:
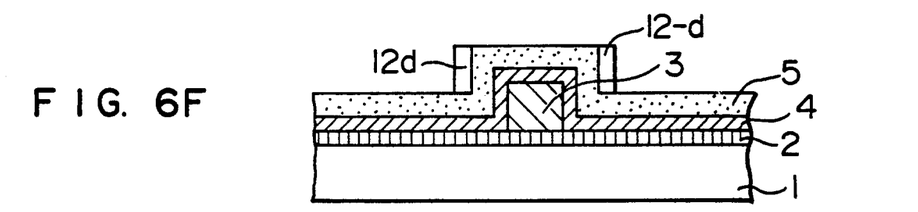

Next, as indicated in FIG. 6E, the SiO$_2$ or Si$_3$N$_4$ film 12 is formed on the semiconductor silicon layer 5 at a thickness of 200-500 nm and the parts 12a, 12b, 12c other than the part 12d corresponding to the side surface of the electrode 3 are removed, by etching directively the film 12 by the RIE (reactive ion etching) method, thereby retaining only the latter, as indicated in FIG. 6F.

Figure 6G:
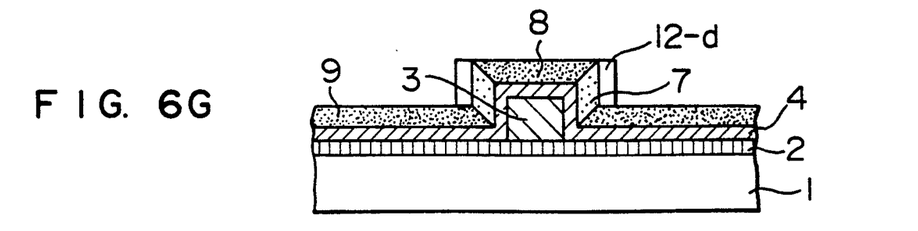

Impurities of a conductivity type (polarity) different from that used in the step mentioned with reference to FIG. 6D are implanted in the semiconductor silicon layer 5 at a high impurity concentration of between $1 \times 10^{18} - 5 \times 10^{20}$ cm$^{-3}$ by the oblique ion implantation method by using the film part 12d as a mask to form the source (or drain) electrode 8 at the part located on the upper surface of the gate electrode 3 and the drain (or source) electrode 9 at the part located on the insulating film 2 adjacent to the gate electrode 3, as indicated in FIG. 6G. The part of the semiconductor silicon layer 5 corresponding to the side surface of the gate electrode 3 is no subjected to the high impurity concentration implantation and used as the channel 7.

By executing the fabrication steps described above by a method stated below it is possible to fabricate a complementary MOS type semiconductor device. The fabrication steps from the preparation of the semiconductor silicon layer 5 to the formation of the source and drain electrodes indicated in FIGS. 6D to 6G are first executed, while masking the area for the semiconductor element 35, to form the drain (or source) electrode 8, 9 of P (or N) conductivity type and the channel 7 of N (or P) conductivity type for the semiconductor element 33. Thereafter the area for the semiconductor element 33 is masked and the fabrication steps indicated in FIGS. 6D to 6G are executed for the semiconductor element 35 to form the drain (or source) electrode 8, 9 of N (or P) conductivity type and the channel 7 of P (or N) conductivity type thereof.

I claim:

1. An MOS type semiconductor device comprising:
   a) a first insulating layer having a thickness larger than 0.1 μm and having a first area defined on said first insulating layer and a second area adjacent to said first area on both sides thereof;
   b) a first conductive layer formed on said first area of said first insulating layer and having an upper surface distant from said first insulating layer and a side surface connecting said upper surface to said first insulating layer;
   c) a second insulating layer covering the upper surface and the side surface of said first conductive layer as well as said second area of said first insulating layer but not said first area, and
   d) a single continuous semiconductor layer covering said second insulating layer, said continuous semiconductor layer defining:
      a first part extending on the upper surface of said first conductive layer, said first part including impurities of a first conductivity type;
      a second part jointed with said first part and extending on the side surface of said first conductive layer, said second part including impurities of a second conductivity type different from the first conductivity type; and
      a third part, jointed with said second part and extending over said second insulating layer at a portion which covers said second area of said first insulating layer, said third part also including impurities of the first conductivity type.

2. An MOS type semiconductor device according to claim 1, further comprising a semiconductor substrate, on which said first insulating layer is formed.

3. An MOS type semiconductor device according to claim 1, wherein said first conductive layer contains a semiconductor material including impurities at a high concentration.

4. An MOS type semiconductor device according to claim 1, wherein said first conductive layer contains at least one of aluminum, copper, chromium, molybdenum and wolfram.

5. An MOS type semiconductor device according to claim 1, wherein said first conductive layer contains silicide of a metal.

6. An MOS type semiconductor device according to claim 1, wherein said second insulating layer contains a silicon nitride film or a silicon oxide film or a composite film thereof.

7. An MOS type semiconductor device according to claim 1, wherein said first conductivity type is a P conductivity type, and said second conductivity type is an N conductivity type.

8. An MOS type semiconductor device according to claim 1, wherein said first conductivity type is an N conductivity type and said second conductivity type is a P conductivity type.

9. An MOS type semiconductor device comprising:
   a) a first insulating layer having a thickness larger than 0.1 μm and having a plurality of first areas defined on said first insulating layer and second areas adjacent to said first areas and alternating therewith;
   b) a plurality of first conductive layers formed selectively on said first areas of said first insulating layer, each of which has an upper surface distant from said first insulating layer and a side surface connecting said upper surface to said first insulating layer;
   c) a second insulating layer covering the upper surface and the side surface of each of said first conductive layers as well as said second area of said first insulating layer adjacent to said side surface; and
   d) a continuous semiconductor layer covering said second insulating layer, said semiconductor layer being formed on said first insulating layer in separate elemental layers corresponding to the respective first conductive layers, each elemental layer of said continuous semiconductor layer defining:
      a first part extending over the upper surface of said first conductive layer, said first part including impurities of a first conductivity type;
      a second part of said continuous semiconductor layer extending adjacent to said first part and on the side surface of said first conductive layer, said second part including impurities of a second conductivity type different from said first conductivity type; and
      a third part extending over a portion of said second insulating layer which covers said second area of said first insulating layer, and adjacent said second part, said third part including impurities of the first conductivity type.

10. An MOS type semiconductor device according to claim 9, further comprising a semiconductor substrate, on which said first insulating layer is formed.

11. An MOS type semiconductor device according to claim 9, wherein said first conductive layers contain a semiconductor material including impurities at a high concentration.

12. An MOS type semiconductor device according to claim 9, wherein said first conductive layers contain at least one of aluminum, copper, chromium, molybdenum and wolfram.

13. An MOS type semiconductor device according to claim 9, wherein said first conductive layers contain silicide of a metal.

14. An MOS type semiconductor device according to claim 9, wherein said second insulating layer contains a silicon nitride film or a silicon oxide film or a composite film thereof.

15. An MOS type semiconductor device according o claim 9, wherein said first conductivity type is a P conductivity type and said second conductivity type is an N conductivity type.

16. An MOS type semiconductor device according to claim 9, wherein said first conductivity type is an N conductivity type and said second conductivity type is a P conductivity type.

17. An MOS type semiconductor device comprising:
a) a first insulating layer having a thickness larger than 0.1 µm and having a first area defined on said first insulating layer and second area adjacent to said first area;
b) a conductive layer formed on said first area of said first insulating layer, and having an upper surface distant from said first insulating layer and a side surface connecting said upper surface and said first insulating layer;
c) a second insulating layer covering the upper surface and the side surface of said conductive layer; and
d) a single semiconductor layer covering said second insulating layer and defining:
a first part formed on the upper surface of said conductive layer, said first part including impurities of a first conductivity type;
a second part formed on the side surface of said conductive layer and jointed with said first part, said second part including impurities of a second conductivity type different from said first conductivity type; and
a third part disposed on said second area of said first insulating layer, said third part being jointed with said second part, said third part including impurities of the first conductivity type.

18. An MOS type semiconductor device comprising:
a) a first insulating layer having a thickness larger than 0.1 µm and having a first area defined on said first insulating layer and a second area adjacent to said first area;
b) a conductive layer formed on said first insulating layer and having an upper surface distant from said first insulating layer and a side surface connecting said upper surface to said first insulating layer;
c) a second insulating layer covering the upper surface of said conductive layer as well as said second area of said first insulating layer; and
d) a single semiconductor layer formed on said second insulating layer and defining
a first part disposed on the upper surface of said conductive layer, said first part including impurities of a first conductivity type at a high concentration;
a second part disposed on the side surface of said conductive layer adjacent said first part, said second part including impurities of a second conductivity type at a concentration lower than said first part, and
a third part disposed at an area, where said second insulating layer covers said second area of said first insulating layer, and adjacent said second part, said third part including impurities of the first conductivity type at a concentration higher than said second part.

19. An MOS type semiconductor device according to claim 18, wherein said first part of said semiconductor layer includes the impurities at about the same concentration as that of said third part.

20. An MOS type semiconductor device comprising:
a) a first insulating layer;
b) a first conductive layer formed on said first insulating layer and having an upper surface distant from said first insulating layer and a side surface connecting said upper surface to said first insulating layer;
c) a second insulating layer covering the upper surface and the side surface of said first conductive layer as well as said first insulating layer, and
d) a semiconductor layer covering said second insulating layer and defining
a first part formed on the upper surface of said first conductive layer, said first part including impurities of a first conductivity type;
a second part formed on the side surface of said first conductive layer and jointed with said first part, said second part including impurities of a second conductivity type different from the first conductivity type; and
a third part formed at a place, where said first insulating layer covers directly said second insulating layer, and jointed with said second part, said third part including impurities of the first conductivity type;
e) a third insulating layer covering said first part, said second part and said third part of said semiconductor layer; and
f) a second conductive layer formed on said third insulating layer principally at a place covering said second part of said semiconductor layer.

21. An MOS type semiconductor device comprising:
a) a first insulating layer;
b) a plurality of first conductive layers formed selectively on said first insulating layer, each of which has an upper surface distant from said first insulating layer and a side surface connecting said upper surface to said first insulating layer;
c) a second insulating layer covering the upper surface and the side surface of each of said first conductive layers as well as said first insulating layer adjacent to said side surface; and
d) a semiconductor layer covering said second insulating layer, said semiconductor layer being formed on said first insulating layer in separate elemental layers corresponding to the respective first conductive layers, each elemental layer having
a first part formed on the upper surface of said first conductive layer, said first part including impurities of a first conductivity type;
a second part formed on the side surface of said first conductive layer and jointed with said first part, said second part including impurities of a second conductivity type different from said first conductivity type; and a third part formed at a place, where said second insulating layer covers directly said first insulating layer, and is jointed with said second part, said third part including impurities of the first conductivity type;

e) a third insulating layer covering said first part, said second part and said third part of said semiconductor layer; and f) a second conductive layer formed on said third insulating layer principally at a place covering said second part of said semiconductor layer.

22. An MOS type semiconductor device according to claim 21, further comprising connecting means for electrically connecting selected one of said first conducive layers or electrically connecting selected one of said third parts of said semiconductor layer.

23. An MOS type semiconductor device comprising:
a) a first insulating layer;
b) a plurality if first conductive layers formed selectively on said first insulating layer, each of which has an upper surface distant from said first insulating layer and a side surface connecting said upper surface to said first insulating layer;
c) a second insulating layer covering the upper surface and the side surface of each of said first conductive layers as well as said first insulating layer adjacent to said side surface; and
d) a semiconductor layer covering said second insulating layer, said semiconductor layer being formed on said first insulating layer in separate elemental layers corresponding to the respective first conductive layers, each elemental layer having a first part formed on the upper surface of said first conductive layer, said first part including impurities of a first conductivity type;

a second part formed on the side surface of said first conductive layer and jointed with said first part, said second part including impurities of a second conductivity type different from said first conductivity type; and a third part formed at a place, where said second insulating layer covers directly said first insulating layer, and jointed with said second part, said third part including impurities of the first conductivity type;

wherein said semiconductor layer includes a first semiconductor region, in which said first part is an N conductivity layer, said second part is a P conductivity type layer, and said third part is an N conductivity type layer, and a second semiconductor region, in which said first part is a P conductivity type layer, said second part is an N conductivity type layer, and said third part is a P conductivity type layer.

24. An MOS type semiconductor device of an SOI structure comprising an insulating base having a first area defined on said first insulating base and a second area adjacent to said first area and one or more semiconductor elements formed on said insulating base, each of said semiconductor elements including:

a) a first layer of electrically conductive material formed on said first area of said insulating base and having an upper surface spaced from said insulating base and a side surface connecting said upper surface and said insulating base;

b) a second layer of dielectric material covering the upper surface and the side surface of said first layer, as well as said second area of said insulating base;

c) a semiconductor layer covering said second layer and defining:

a first part extending on the upper surface of said first layer, said first part including impurities of a first conductivity type;

a second part jointed with said first part and extending on the side surface of said first layer, said second part including impurities of a second conductivity type different from said first conductivity type; and a third part jointed with said second part and extending over an area of said second layer which covers said second area of said insulating base, said third part including impurities of said first conductivity type.

25. An MOS type semiconductor device according to claim 24, wherein said insulating base has a thickness larger than 0.1 $\mu$m.

26. An MOS type semiconductor device of an SOI structure comprising an insulating base having a first area defined on said first insulating base and a second area adjacent to said first area and at least one MOS type semiconductor element formed on said insulating base, said semiconductor element comprising:

a) an electrically conductive layer formed on first area of said insulating base, said electrically conductive layer having an upper surface spaced from said insulating base and a side surface connecting said upper surface and said insulating base;

b) a dielectric layer extending to cover the upper surface and the side surface of said conductive layer and to cover the second area of said insulating base;

c) a semiconductor layer extending to cover said dielectric layer and defining:

a first part disposed on the upper surface of said electrically conductive layer, said first part including impurities of a first conductivity type;

a second part jointed with said first part and disposed on the side surface of said electrically conductive layer, said second part including impurities of a second conductivity type different from said first conductivity type; and a third part jointed with said second part and disposed on said second area of said insulating base, said third part including impurities of said first conductivity type.

27. An MOS type semiconductor device according to claim 26, wherein said insulating base has a thickness larger than about 0.1 $\mu$m.

* * * * *